United States Patent
Tsai et al.

[19]

[11] Patent Number: 5,803,696
[45] Date of Patent: Sep. 8, 1998

[54] SAFETY INTERLOCK DEVICE FOR A STANDARD MANUFACTURING INTERFACE ARM AND EQUIPMENT

[75] Inventors: Po-Yueh Tsai, Peng-Hong; Rea-Chang Wang, Hsin-Chu; Te Yun Lin; Y. F. Lin, both of Chin-Chu, all of Taiwan

[73] Assignee: Taiwan Semiconductor Manufacturing Company, Ltd., Hsin-Chu, Taiwan

[21] Appl. No.: 857,965

[22] Filed: May 16, 1997

[51] Int. Cl.⁶ .................................................. B65G 1/04
[52] U.S. Cl. ........................ 414/416; 414/811; 414/937; 901/9; 901/47
[58] Field of Search .................................. 414/217, 416, 414/937, 938, 940, 786, 805, 811; 901/9, 47; 318/478

[56] References Cited

U.S. PATENT DOCUMENTS

| | | | |
|---|---|---|---|
| 4,437,114 | 3/1984 | La Russa | 901/9 X |
| 4,895,486 | 1/1990 | Baker et al. | 901/47 X |
| 4,900,212 | 2/1990 | Mikahara | 414/937 X |
| 5,030,057 | 7/1991 | Nishi et al. | 901/47 X |
| 5,059,079 | 10/1991 | Foulke et al. | 414/940 X |
| 5,096,353 | 3/1992 | Tesh et al. | 901/47 X |
| 5,547,328 | 4/1996 | Bonora et al. | 414/217 |
| 5,562,383 | 10/1996 | Iwai et al. | 414/940 X |
| 5,604,443 | 2/1997 | Kitamura et al. | 414/937 X |
| 5,700,127 | 12/1997 | Harada et al. | 414/940 X |

FOREIGN PATENT DOCUMENTS

| | | | |
|---|---|---|---|
| 104135 | 5/1987 | Japan | 414/940 |
| 244634 | 9/1989 | Japan | 414/937 |
| 23647 | 1/1991 | Japan | 414/937 |
| 10639 | 1/1992 | Japan | 414/937 |

*Primary Examiner*—David A. Bucci
*Attorney, Agent, or Firm*—George O. Saile; Stephen B. Ackerman; Larry J. Prescott

[57] ABSTRACT

A safety interlock system and method of unloading a standard manufacturing cassette using a safety interlock system are described which prevent the robotic arm used to unload the cassettes from unloading the cassette unless the cassette is in the proper unloading position. The safety interlock system uses a light beam emitted by a light source and illuminating a light sensitive switch if the cassette is not in the proper unloading position. If the cassette is in the proper unloading position the cassette interrupts the light beam and the light sensitive switch is not illuminated. Illuminating the light sensitive switch energizes a relay primary coil which interrupts power delivered to the electrical control unit of the robotic arm and activates an alarm unit.

21 Claims, 3 Drawing Sheets

FIG. 1 - Prior Art

SAFETY INTERLOCK DEVICE FOR A STANDARD MANUFACTURING INTERFACE ARM AND EQUIPMENT

BACKGROUND OF THE INVENTION (1) Field of the Invention

This invention relates to a safety interlock system for a standard manufacturing interface system. More particularly the invention relates to an interlock system which prevents a robotic arm, used to unload a cassette transporting integrated circuit wafers or the like, from unloading the cassette if the cassette is not in the proper position for unloading.

(2) Description of the Related Art

U.S. Pat. No. 5,547,328 to Bonora et al. describes a method and apparatus for transferring articles from a transportable container, such as a standard manufacturing interface pod, to a second container, such as a processing station. A safety interlock system such as described in the present invention is not described.

SUMMARY OF THE INVENTION

In modern manufacturing facilities for the manufacture of integrated circuit wafers increasing the level of automation is important for both precision and maintaining cleanliness of the process steps used in the manufacture of the integrated circuit wafers. Standard manufacturing interface units or cassettes are often used for transporting integrated circuit wafers from one processing station to another. When these cassettes reach the appropriate processing station the integrated circuit wafers are unloaded using a robotic arm for processing.

FIG. 1 shows a diagram of a typical apparatus used for unloading a cassette. When the cassette 10 reaches the processing station the unloading operation is initiated by an operator closing a switch 16. When the switch 16 is closed the power supply 14 supplies electrical power to the electrical control unit 12 for the robotic arm 44. When electrical power is supplied to the electrical control unit 12 the robotic arm 44 unloads the cassette 10. If the switch 16 is closed when the cassette 10 is not in the proper position, the home position, the robotic arm 44 will try to unload the cassette and serious damage to the cassette and the integrated circuit wafers can result.

It is a principle objective of this invention to provide a safety interlock device for a standard manufacturing interface system which will allow the robotic arm to unload the cassette normally when the cassette is in the home position and will prevent the robotic arm from operating if the cassette is at a position other than the home position.

It is another principle objective of this invention to provide a method of using a standard manufacturing interface system to unload a cassette so that a robotic arm will unload a cassette normally when the cassette is in the home position and the robotic arm will not operate if the cassette is at a position other than the home position.

These objectives are accomplished with a safety interlock device comprising a light source, which emits a light beam, and a light sensitive switch, having a light input window. The light sensitive switch is closed when the light beam emitted by the light source illuminates the light input window and is open if the light beam does not illuminate the light input window. A number of mirrors are arranged to reflect the light beam emitted by the light source so that it illuminates the light input window unless the light beam is interrupted.

The light source, light sensitive switch, mirrors, and cassette are arranged so that if the cassette is in the proper position for unloading the cassette interrupts the light beam emitted by the light source and the light beam cannot illuminate the light input window of the light sensitive switch. If the cassette is not in the proper position for unloading the cassette the cassette will not be in position to interrupt the light beam and the light beam will illuminate the light sensitive switch.

A number of circuits are used so that when the switch is closed to unload the cassette electrical power is supplied to the light source. Electrical power is supplied to the control unit of the robotic arm and the unloading operation proceeds only if the light beam emitted by the light source is interrupted and does not illuminate the light input window of the light sensitive switch. If the light beam emitted by the light source is not interrupted and illuminates the light input window of the light sensitive switch an electrical relay is opened and electrical power can not be supplied to the control unit of the robotic arm. An alarm unit indicates that power cannot be supplied to the control unit of the robotic arm because the light beam has not been interrupted and does illuminate the light input window of the light sensitive switch.

In the cassette unloading operation an operator closes the switch and the cassette is unloaded if the cassette is in the proper position for unloading. If the cassette is not in the proper position for unloading when the operator closes the switch no power can be supplied to the control unit of the robotic arm and an alarm system indicates that the proper conditions for unloading the cassette are not present.

DESCRIPTION OF THE PREFERRED EMBODIMENTS

Figure 1:
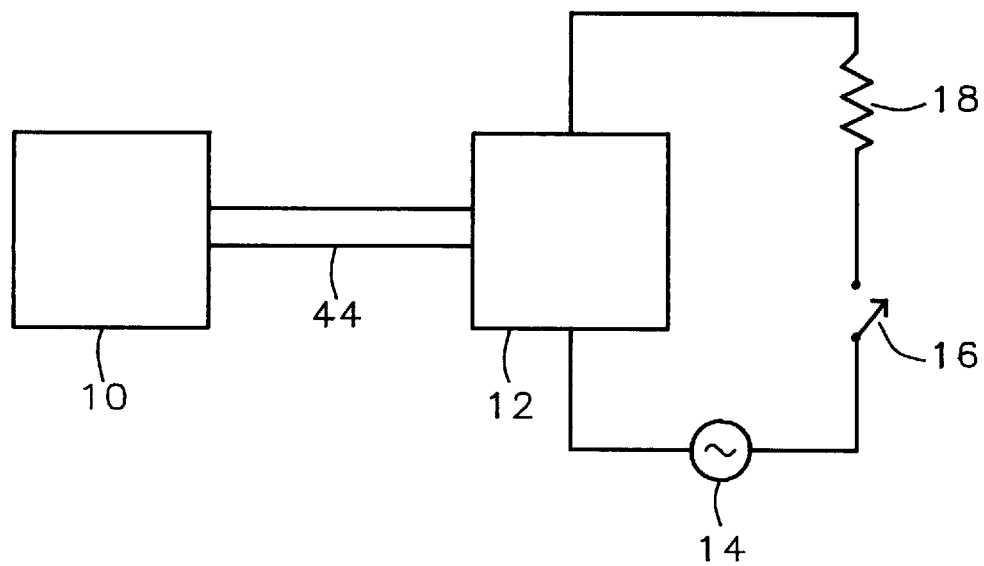
FIG. 1 shows a diagram of the robotic arm, robotic arm control unit, cassette, and conventional circuit used to supply electrical power to the control unit of the robotic arm.
Figure 2:
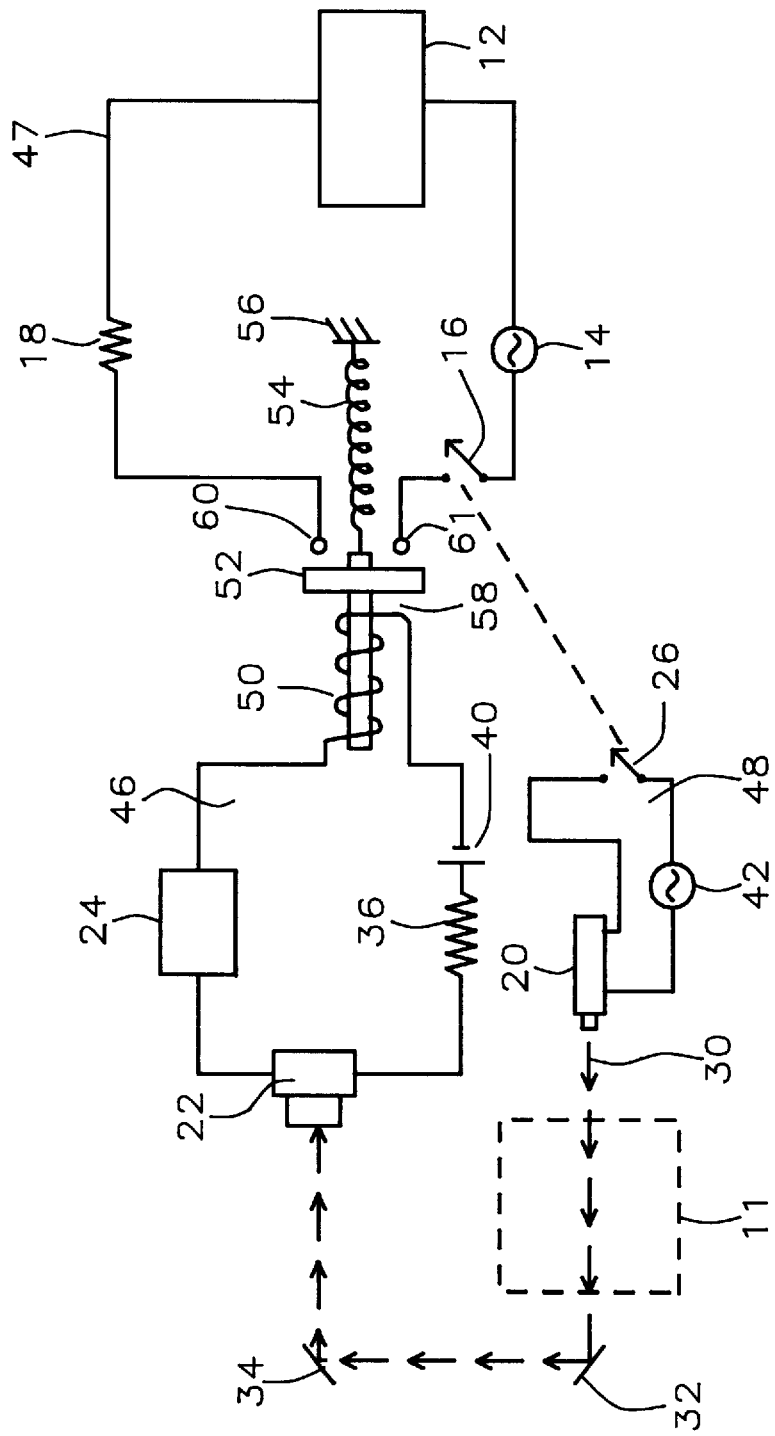
FIG. 2 shows a diagram of the safety interlock circuit and apparatus of this invention where the cassette is not in the proper position for unloading and does not interrupt the light beam.
Figure 3:
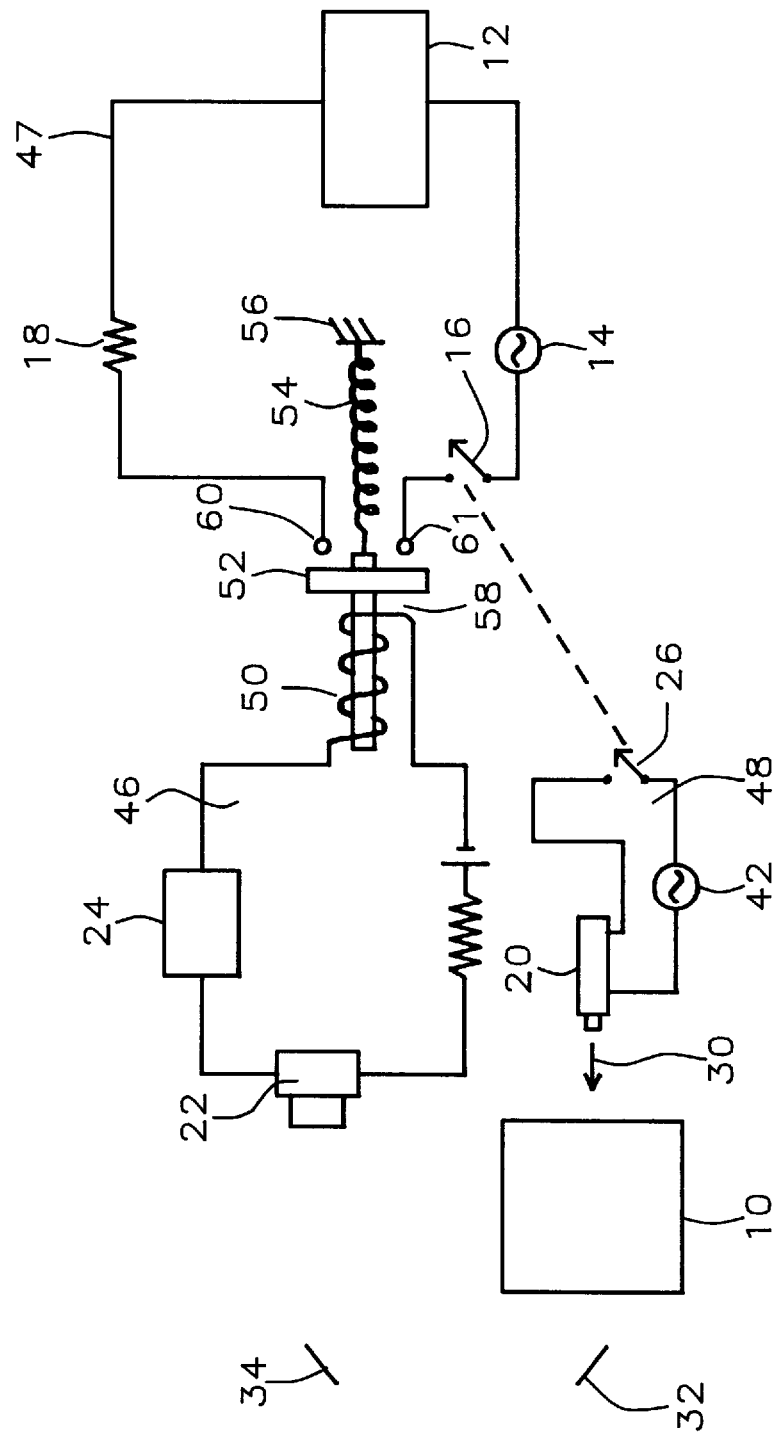
FIG. 3 shows a diagram of the safety interlock circuit and apparatus of this invention where the cassette is in the proper position for unloading and interrupts the light beam.

Refer now to FIGS. 1–3 for a detailed description of the apparatus, circuits and method of this invention. FIG. 1 shows a diagram of the control unit 12 for a robotic arm 44 used to unload a cassette 10 in a standard manufacturing interface system. As an example the cassette may contain an number of integrated circuit wafers to be transported from one processing station to another. When the cassette arrives at each processing station it must be unloaded so the integrated circuit wafers can be processed. To unload the cassette an operator closes a first switch 16 and the unloading operation continues if the cassette is in the proper position.

FIGS. 2 and 3 show diagrams of the apparatus and circuit of this invention used to provide a safety interlock for the unloading operation. FIG. 2 shows the diagram when the cassette is at a secondary position and is not in the proper position for unloading. FIG. 2 shows a light source 20, in this example a LASER, emitting a light beam 30 when electrical power is supplied to the light source. The light beam 30 is reflected by a first mirror 32 and a second mirror 34 and illuminates a light input window of a light sensitive switch 22. The light sensitive switch is closed when the light beam illuminates the light input window of the light sensitive switch and open when the light beam does not illuminate the light input window of the light sensitive switch.

FIG. 2 shows a first circuit 46, a second circuit 48, and a third circuit 48. The first circuit 46 has the light sensitive switch 22, a first electrical power supply 40, a first resistor 36, an alarm unit 24, and the primary coil 50 of a relay 58 connected in series. In this example the first electrical power supply 40 is a direct current power supply and the alarm unit 24 comprises an alarm lamp and a buzzer. The second circuit 47 has a second electrical power supply 14, a second resistor 18, a first electrical switch 16, the electrical control unit 12 for the robotic arm, the first output terminal 60 of the relay 58, and the second output terminal 61 of the relay 58 connected in series. The robotic arm is not shown in FIG. 2 but mechanically couples the electrical control unit 12 to the cassette as previously described and shown in FIG. 1. The relay 58 is in both the first circuit 46 and the second circuit. A spring 54 attached to a base point 56 holds the contact plate 52 against the first output terminal 60 and second output terminal 61, thereby shorting them together, when there is no electrical power supplied to the primary coil 50 of the relay 58 by the first circuit 46. When the first circuit 46 supplies electrical power to the primary coil 50 of the relay 58 and the contact plate 52 is pulled away from the first output terminal 60 and the second output terminal 61, thereby causing an electrical open circuit between the first output terminal 60 and the second output terminal 61. The third electrical circuit 48 has a third electrical power supply 42, a second electrical switch 26, and the electrical power input terminals of the light source 20 connected in series. The second electrical switch 26 is coupled to the first electrical switch 16 so that the second electrical switch 26 is open when the first electrical switch 16 is open and the second electrical switch 26 is closed when the first electrical switch 16 is closed.

When an operator attempts to unload a cassette which is in a secondary position and not in the proper position for unloading, the situation of the diagram shown in FIG. 2, the first switch 16 is closed. Closing the first switch 16 also closes the second switch 26 so that the light source 20 emits a light beam 30. The light beam is reflected by the first mirror 32 and the second mirror 34 to illuminate the light input window of the light sensitive switch 22, thereby closing the light sensitive switch 22. When the light sensitive switch 22 is closed electrical power is supplied to the alarm unit 24 and the primary coil 50 of the relay 58. When the primary coil 50 of the relay 58 is energized the electrical open circuit created between the first relay output terminal 60 and the second relay output terminal 61 prevents the first electrical power supply 14 from supplying electrical power to the electrical control unit 12 of the robotic arm. When electrical power is supplied to the alarm unit 24 the buzzer sounds and the alarm lamp is illuminated. When an operator attempts to unload a cassette which is in a secondary position and not in the proper position for unloading no power is supplied to the electrical control unit 12 of the robotic arm, a warning buzzer sounds, and an alarm lamp is illuminated.

FIG. 3 shows the diagram when the cassette is at the home position and is in the proper position for unloading. FIG. 3 is the same as FIG. 2 except that the cassette 10 is in the home position and interrupts the light beam 30 emitted by the light source. In this situation the light beam 30 is interrupted by the cassette 10 in the home position and does not illuminate the light input window of the light sensitive switch 22. The light sensitive switch 22 will always be open when the cassette 10 is in the home position. FIG. 3 also shows the first circuit 46, the second circuit 47, and the third circuit 48 shown in FIG. 2 and described above.

When an operator attempts to unload a cassette which is in the home position or the proper position for unloading, the situation of the diagram shown in FIG. 3, the first switch 16 is closed. Closing the first switch 16 also closes the second switch 26 so that the light source 20 emits a light beam 30. The light beam 30 is interrupted by the cassette 10 so that the light sensitive switch is open, electrical power can not be supplied to the primary coil 50 of the relay 58, and the first relay output terminal 60 and the second relay output terminal 61 are shorted together. In this situation the second electrical power supply 14 supplies electrical power to the electrical control unit 12 of the robotic arm and the cassette is unloaded. No electrical power is supplied to the alarm unit 24 so that the buzzer does not sound and the alarm lamp is not illuminated.

To keep the diagrams focused on the key parts of the invention the robotic arm between the electrical control unit and the cassette is not shown in FIGS. 2 and 3 but is shown in FIG. 1.

When the operator prepares to unload the cassette at a particular process station the operator, who expects the cassette to be in the home position, closes the first switch 16, which also closes the second switch 26. If the cassette is in the home position, the situation shown in FIG. 3, closing the first switch allows the second power supply 14, in this example an alternating current power supply, to supply electrical power to the electrical control unit 12 of the robotic arm and the cassette is unloaded.

If the cassette is not in the home position, the situation shown in FIG. 2, closing the first switch 16 by the operator, which also closes the second switch 26, allows the third power supply 42 to supply electrical power to the light source, in this example the third power supply is an alternating current power supply. The light source 20 then emits a light beam 30 which illuminates the light input window of the light sensitive switch 22. The light sensitive switch 22 then closes and the first power supply 40, in this example the first power supply is a direct current power supply, to energize the primary coil 50 of the relay 58. A open circuit is then created between the first output terminal 60 and the second output terminal 61 of the relay. No electrical power is delivered to the electrical control unit 12 of the robotic arm, the cassette is not unloaded, and the alarm unit alerts the operator that corrective action must be taken.

While the invention has been particularly shown and described with reference to the preferred embodiments thereof, it will be understood by those skilled in the art that various changes in form and details may be made without departing from the spirit and scope of the invention.

What is claimed is:

1. A safety interlock, comprising:
   an opaque device wherein said opaque device is located at a home position or a number of secondary positions;
   an electromechanical device having electrical input terminals mechanically coupled to said opaque device wherein said electromechanical device supplies mechanical power to said opaque device when electrical power is supplied to said input terminals of said electromechanical device;
   a first electrical switch;

a light source having electrical power input terminals, wherein said light source emits a light beam when electrical power is supplied to said electrical power input terminals of said light source;

a light sensitive switch having a light input window, wherein said light sensitive switch is closed when said light input window is illuminated by said light beam emitted by said light source and is open when said light input window is not illuminated by said light beam emitted by said light source;

means for reflecting said light beam emitted by said light source so that said light beam illuminates said light input window of said light sensitive switch when said opaque device is in one of said secondary positions and preventing said light beam emitted by said light source from illuminating said light input window of said light sensitive switch when said opaque device is in said home position;

a relay having a primary coil, a first output terminal., and a second output terminal, wherein said first output terminal and said second output terminal are electrically insulated from said primary coil, said first output terminal is electrically insulated from said second output terminal when no electrical power is supplied to said primary coil, and said first output terminal is electrically connected to said second output terminal when electrical power is supplied to said primary coil;

a first circuit comprising said light sensitive switch, a first electrical power supply, a first resistor, an alarm unit, and said primary coil of said relay connected in series;

a second circuit comprising a second electrical power supply, a second resistor, said first electrical switch, said electrical input terminals of said electromechanical device, said first output terminal of said relay, and said second output terminal of said relay connected in series; and a third circuit comprising a third electrical power supply, a second electrical switch, and said electrical power input terminals of said light source connected in series, wherein said second electrical switch is coupled to said first electrical switch so that said second electrical switch is open when said first electrical switch is open and said second electrical switch is closed when said first electrical switch is closed.

2. The safety interlock of claim 1 wherein said opaque device is a cassette for transporting integrated circuit wafers.

3. The safety interlock of claim 1 wherein said electromechanical device comprises a robotic arm and an electrical control unit for said robotic arm.

4. The safety interlock of claim 2 wherein said electromechanical device comprises a robotic arm for loading and unloading said cassette and an electrical control unit for said robotic arm.

5. The safety interlock of claim 1 wherein said light source having electrical power input terminals is a LASER.

6. The safety interlock of claim 1 wherein said light sensitive switch is a light sensitive diode.

7. The safety interlock of claim 1 wherein said means for reflecting said light beam emitted by said light source comprises a number of mirrors.

8. The safety interlock of claim 1 wherein said alarm unit comprises an alarm lamp and a buzzer connected so that said alarm lamp is activated and said buzzer sounds when electrical power is supplied to said primary coil of said relay.

9. The safety interlock of claim 1 wherein said first electrical power supply is a direct current power supply, said second power supply is an alternating current power supply, and said third power supply is an alternating current power supply.

10. A standard manufacturing interface safety interlock, comprising:

a cassette for transporting integrated circuit wafers wherein said cassette is located at a home position or a number of secondary positions;

a robotic arm having electrical input terminals wherein said robotic arm unloads said cassette when electrical power is supplied to said electrical input terminals of said robotic arm;

a first electrical switch;

a light source having electrical power input terminals, wherein said light source emits a light beam when electrical power is supplied to said electrical power input terminals of said light source;

a light sensitive switch having a light input window, wherein said light sensitive switch is closed when said light input window is illuminated by said light beam emitted by said light source and is open when said light input window is not illuminated by said light beam emitted by said light source;

means for reflecting said light beam emitted by said light source so that said light beam illuminates said light input window of said light sensitive switch when said cassette is in one of said secondary positions and preventing said light beam emitted by said light source from illuminating said light input window of said light sensitive switch when said cassette is in said home position;

a relay having a primary coil, a first output terminal, and a second output terminal, wherein said first output terminal and said second output terminal are electrically insulated from said primary coil, said first output terminal is electrically insulated from said second output terminal when no electrical power is supplied to said primary coil, and said first output terminal is electrically connected to said second output terminal when electrical power is supplied to said primary coil;

a first circuit comprising said light sensitive switch, a first electrical power supply, a first resistor, an alarm unit, and said primary coil of said relay connected in series;

a second circuit comprising a second electrical power supply, a second resistor, said first electrical switch, said electrical input terminals of said robotic arm, said first output terminal of said relay, and said second output terminal of said relay connected in series; and a third circuit comprising a third electrical power supply, a second electrical switch, and said electrical power input terminals of said light source connected in series, wherein said second electrical switch is coupled to said first electrical switch so that said second electrical switch is open when said first electrical switch is open and said second electrical switch is closed when said first electrical switch is closed.

11. The standard manufacturing interface safety interlock of claim 10 wherein said light source having electrical power input terminals is a LASER.

12. The standard manufacturing interface safety interlock of claim 10 wherein said light sensitive switch is a light sensitive diode.

13. The standard manufacturing interface safety interlock of claim 10 wherein said means for reflecting said light beam emitted by said light source comprises a first mirror and a second mirror.

14. The standard manufacturing interface safety interlock of claim 10 wherein said alarm unit comprises an alarm lamp and a buzzer connected so that said alarm lamp is activated and said buzzer sounds when electrical power is supplied to said primary coil of said relay.

15. The standard manufacturing interface safety interlock of claim 10 wherein said first electrical power supply is a direct current power supply, said second electrical power supply is an alternating current power supply, and said third electrical power supply is an alternating current power supply.

16. A method of unloading a standard manufacturing interface cassette, comprising the steps of:

providing a cassette for transporting integrated circuit wafers wherein said cassette is located at a home position or a number of secondary positions;

providing a robotic arm having electrical input terminals wherein said robotic arm unloads said cassette when electrical power is supplied to said electrical input terminals of said robotic arm;

providing a first electrical switch;

providing a light source having electrical power input terminals, wherein said light source emits a light beam when electrical power is supplied to said electrical power input terminals of said light source;

providing a light sensitive switch having a light input window, wherein said light sensitive switch is closed when said light input window is illuminated by said light beam emitted by said light source and is open when said light input window is not illuminated by said light beam emitted by said light source;

providing means for reflecting said light beam emitted by said light source so that said light beam illuminates said light input window of said light sensitive switch when said cassette is in one of said secondary positions and preventing said light beam emitted by said light source from illuminating said light input window of said light sensitive switch when said cassette is in said home position;

providing a relay having a primary coil, a first output terminal, and a second output terminal, wherein said first output terminal and said second output terminal are electrically insulated from said primary coil, said first output terminal is electrically insulated from said second output terminal when no electrical power is supplied to said primary coil, and said first output terminal is electrically connected to said second output terminal when electrical power is supplied to said primary coil;

connecting said light sensitive switch, a first electrical power supply, a first resistor, an alarm unit, and said primary coil of said relay in series, thereby forming a first circuit;

connecting a second electrical power supply, a second resistor, said first electrical switch, said electrical input terminals of said robotic arm, said first output terminal of said relay, and said second output terminal of said relay in series, thereby forming a second circuit;

connecting a third electrical power supply, a second electrical switch, and said electrical Power input terminals of said light source in series, thereby forming a third circuit, wherein said second electrical switch is coupled to said first electrical switch so that said second electrical switch is open when said first electrical switch is open and said second electrical switch is closed when said first electrical switch is closed; and closing said first electrical switch.

17. The method of claim 16 wherein said light source having electrical power input terminals is a LASER.

18. The method of claim 16 wherein said light sensitive switch is a light sensitive diode.

19. The method claim 16 wherein said means for reflecting said light beam emitted by said light source comprises a first mirror and a second mirror.

20. The method of claim 16 wherein said alarm unit comprises an alarm lamp and a buzzer connected so that said alarm lamp is activated and said buzzer sounds when electrical power is supplied to said primary coil of said relay.

21. The method of claim 16 wherein said first electrical power supply is a direct current power supply, said second electrical power supply is an alternating current power supply, and said third electrical power supply is an alternating current power supply.

* * * * *